(12) United States Patent
Matsuo

(10) Patent No.: US 7,710,220 B2
(45) Date of Patent: May 4, 2010

(54) SURFACE ACOUSTIC WAVE DEVICE

(75) Inventor: Hiroshi Matsuo, Yokohama (JP)

(73) Assignee: Fujitsu Media Devices Limited, Yokohama (JP)

( * ) Notice: Subject to any disclaimer, the term of this patent is extended or adjusted under 35 U.S.C. 154(b) by 174 days.

(21) Appl. No.: 11/984,434

(22) Filed: Nov. 16, 2007

(65) Prior Publication Data

US 2008/0130205 A1 Jun. 5, 2008

(30) Foreign Application Priority Data

Nov. 17, 2006 (JP) ............................. 2006-311491

(51) Int. Cl.
*H03H 9/10* (2006.01)
*H01L 41/09* (2006.01)

(52) U.S. Cl. ..................................... 333/193; 310/349

(58) Field of Classification Search ............... 333/193, 333/194, 195, 196; 310/313 R, 340, 344, 310/349

See application file for complete search history.

(56) References Cited

U.S. PATENT DOCUMENTS 6,897,742 B2 * 5/2005 Matsuo .................... 333/150
2006/0022768 A1 2/2006 Yokota et al.

FOREIGN PATENT DOCUMENTS

| CN | 1728550 A | | 2/2006 |
| CN | 200510087932 | | 2/2006 |
| JP | 11-055057 | * | 2/1999 |
| JP | 2002-171154 A | | 6/2002 |
| JP | 2005-348281 A | | 12/2005 |

\* cited by examiner

*Primary Examiner*—Dean O Takaoka
(74) *Attorney, Agent, or Firm*—Arent Fox LLP

(57) ABSTRACT

A surface acoustic wave device includes a base portion that surrounds a surface acoustic wave element and is made of a resin, and a cap portion that is adhered onto the base portion so that a cavity sealing the surface acoustic wave element is formed, and is made of a resin. At least one of an adhering face of the base portion and an adhering face of the cap portion adhering the base portion and the cap portion is subjected to a grain finish or a dull finish. A convex portion is provided inside of the adhering face that is of one of the base portion and the cap portion adhered to the other.

6 Claims, 5 Drawing Sheets

SURFACE ACOUSTIC WAVE DEVICE

BACKGROUND OF THE INVENTION

1. Field of the Invention

The present invention relates to a surface acoustic wave device, in particular, relates to a surface acoustic wave device having a base portion and a cap portion made of a resin.

2. Description of the Related Art

A surface acoustic wave device is widely used as a signal filter of an electrical and electronic device using an electromagnetic wave. The surface acoustic wave device is used as a transmitting and receiving filter of a radio communication device such as a mobile phone or a frequency filter for visual such as a television or a videotape recorder. In the surface acoustic wave device, a surface acoustic wave element is mounted on a package or the like. The surface acoustic wave element has a structure in which an electrode exciting a surface acoustic wave such as a comb electrode is provided on a piezoelectric substrate made of $LiNbO_3$, $LiTaO_3$ or the like. It is necessary to form a space on the piezoelectric substrate and on the electrode, because the surface acoustic wave propagates on a surface of the piezoelectric substrate. It is necessary to seal the surface acoustic wave element in order to gain trust, because there is not provided a protective membrane on the piezoelectric substrate and on the electrode.

There is a case where the surface acoustic wave element is mounted on a package made of a resin having a cavity, in order to reduce a cost of the surface acoustic wave device. In this case, the surface acoustic wave element is mounted on a base portion made of a resin, and the cap portion is adhered to the base portion so as to seal the surface acoustic wave element. The surface acoustic wave element is thus sealed in the cavity formed with the base portion and the cap portion.

Japanese Patent Application Publication No. 2002-171154 (hereinafter referred to as Document 1) discloses a surface acoustic wave device in which at least one of adhering faces of a base portion and a cap portion has a dull finish and adherence strength between the base portion and the cap portion is improved.

It is demanded that the base portion and the cap portion are not separated from each other, and an adherence between the base portion and the cap portion is resistant to a solder reflow, thermal shock of a soldering or a humidity. It is therefore demanded that the base portion is adhered to the cap portion at an adhering face. For example, adherence is obtained between components having a high affinity if the cap portion and the base portion are made of a thermosetting epoxy resin and the adhesive agent is made of an epoxy-based resin. It is however not possible to obtain a sufficient adherence strength.

With the art disclosed in Document 1, it is possible to improve the adherence strength between the base portion and the cap portion. However, an adhering area between the base portion and the cap portion is reduced, as the surface acoustic wave device is downsized. In this case, the adherence strength between the base portion and the cap portion is not sufficient even if the art disclosed in Document 1 is used.

SUMMARY OF THE INVENTION

The present invention has been made in view of the above circumstances and provides a surface acoustic wave device of which adherence strength between a base portion and a cap portion is further improved.

According to an aspect of the present invention, there is provided a surface acoustic wave device including a base portion that surrounds a surface acoustic wave element and is made of a resin, and a cap portion that is adhered onto the base portion so that a cavity sealing the surface acoustic wave element is formed, and is made of a resin. At least one of an adhering face of the base portion and an adhering face of the cap portion adhering the base portion and the cap portion is subjected to a grain finish or a dull finish. A convex portion is provided inside of the adhering face that is of one of the base portion and the cap portion adhered to the other. With the structure, it is possible to restrain a peeling between the base portion and the cap portion. And it is possible to improve resistant to thermal shock and resistant to humidity.

BRIEF DESCRIPTION OF THE DRAWINGS

Preferred embodiments of the present invention will be described in detail with reference to the following drawings, wherein.

DESCRIPTION OF THE PREFERRED EMBODIMENTS

A description will now be given, with reference to the accompanying drawings, of embodiments of the present invention.

First Embodiment

Figure 1A:
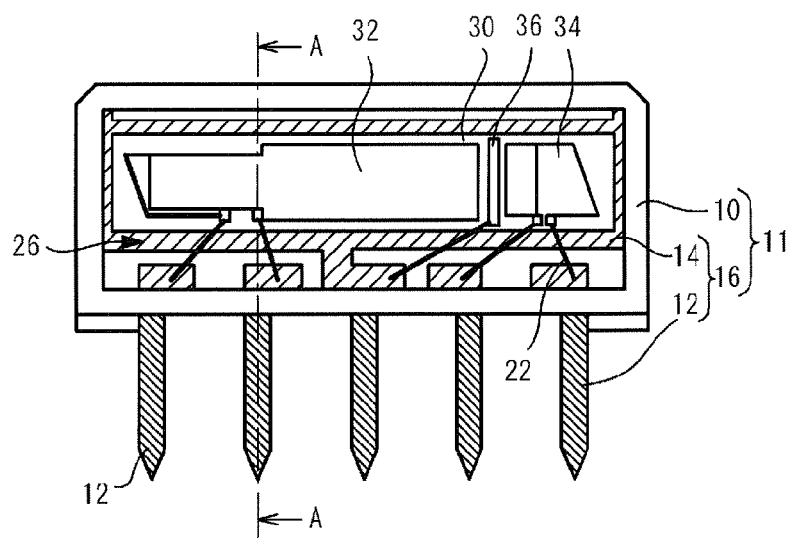
FIG. 1A illustrates a top view of a surface acoustic wave device in accordance with a first embodiment (a cap portion is not shown)
Figure 1B:
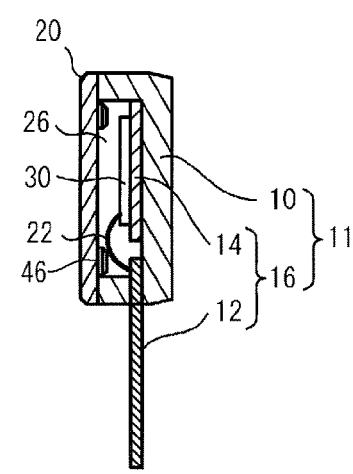
FIG. 1B illustrates a cross sectional view taken along a line A-A of FIG. 1A.

FIG. 1A illustrates a top view of a surface acoustic wave device in accordance with a first embodiment. FIG. 1B illustrates a cross sectional view taken along a line A-A of FIG. 1A. In FIG. 1A, a cap portion is not shown. The surface acoustic wave device in accordance with this embodiment has a surface acoustic wave element 30, a surrounding portion 10, a cap portion 20, and a lead frame 16. The surrounding portion 10 and the cap portion 20 are made of a thermosetting epoxy resin. The lead frame 16 is made of copper alloy and has electrical conductivity. The surrounding portion 10 and the lead frame 16 are formed integrally, and form a base portion 11. The surface acoustic wave element 30 is mounted on a die pad 14 of the lead frame 16 with an adhesive agent. An input portion 32 and an output portion 34 are formed in the surface acoustic wave element 30. A ground portion 36 is formed between the input portion 32 and the output portion 34.

The surrounding portion 10 is provided around and under the die pad 14, and surrounds the surface acoustic wave element 30. The surrounding portion 10 has a bank shape so as to surround the die pad 14. There are provided five leads 12 of the lead frame 16 from an inside of the bank to an outside of the bank of the surrounding portion 10. Two balanced output terminals of the output portion 34 are connected to two of the leads 12 on the right side in FIG. 1A through a bonding wire 22. Two balanced input terminals of the input portion 32 are connected to two of the leads 12 on the left side of FIG. 1A through another bonding wire 22. The center lead 12 is connected to the die pad 14 and to the ground terminal of the surface acoustic wave element 30. The cap portion 20 made of resin is adhered onto the surrounding portion 10. The surrounding portion 10 and the cap portion 20 form a cavity 26 sealing the surface acoustic wave element 30.

Figure 2A:
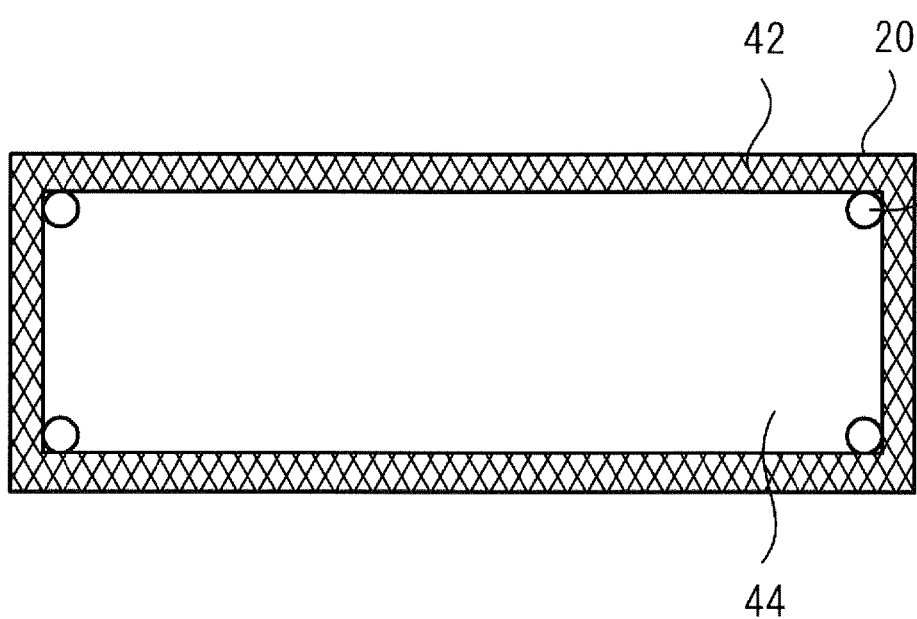
FIG. 2A illustrates a bottom view of a cap portion in accordance with the first embodiment.
Figure 2B:
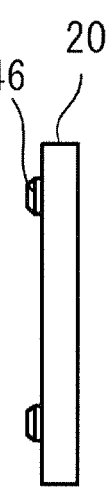
FIG. 2B illustrates a side view of the cap portion.

FIG. 2A illustrates a bottom view of the cap portion 20. FIG. 2B illustrates a side view of the cap portion 20. As shown in FIG. 2A, an adhering face 42 of the cap portion 20, to which the surrounding portion 10 is adhered, is subjected to a grain finish or a dull finish. A concavity and a convexity formed with the grain finish and the dull finish have a height or a depth of, for example, 5 μm to 10 μm. On the other hand, a face 44 of the cap portion 20 other than the adhering face 42 is not subjected to the grain finish and the dull finish. The cap portion 20 has a round-shaped convex portion 46 on an inside of the adhering face 42 to be adhered to the surrounding portion 10. Thus, a part of a side face of the round-shaped convex portion 46 can be adhered to a side face of the surrounding portion on the side of the cavity 26. In accordance with the first embodiment, the surrounding portion 10 is solidly adhered to the cap portion 20 with the grain finished or dull finished adhering face 42. And the side face of the round-shaped convex portion 46 is adhered to the side face of the surrounding portion 10. It is therefore possible to strengthen the adherence between the surrounding portion 10 and the cap portion 20. Thus, it is possible to restrain a peeling between the base portion 11 and the cap portion 20. And it is possible to improve resistance to thermal shock and resistance to humidity. There may be provided more than one round-shaped convex portion 46. It is however preferable that the round-shaped convex portion 46 is provided on the four corners of the adhering face in order to strengthen the adhesiveness. The round-shaped convex portion 46 may be used, as a guide for position determination of the cap portion 20 with respect to the surrounding portion 10.

Figures 3A, 3B:
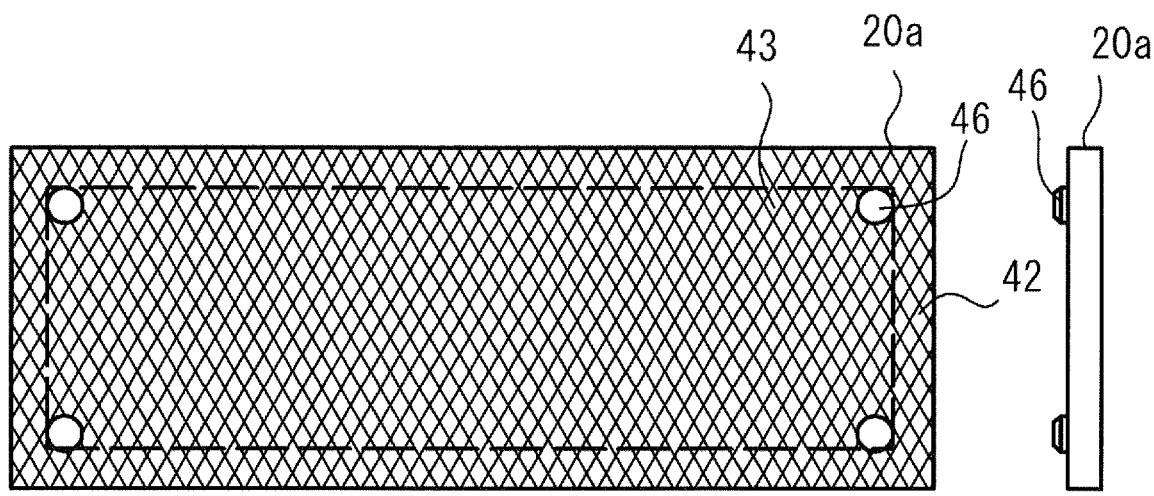
FIG. 3A illustrates a bottom view of another cap portion in accordance with the first embodiment.
FIG. 3B illustrates a side view of the cap portion.

FIG. 3A illustrates a bottom view of another cap portion. A whole of the cap portion including the adhering face 42 is subjected to the grain finish or the dull finish. That is, a face 43 other than the adhering face 42 is also subjected to the grain finish or the dull finish. The grain finish or the dull finish are performed to at least the adhering face 42.

And, an adhering face 40 of the surrounding portion 10 adhered to the cap portion 20 may be subjected to the grain finish or the dull finish. The grain finish or the dull finish is performed to at least one of the adhering face 42 of the cap portion 20 and the adhering face 40 of the surrounding portion 10.

Second Embodiment

Figure 4A:
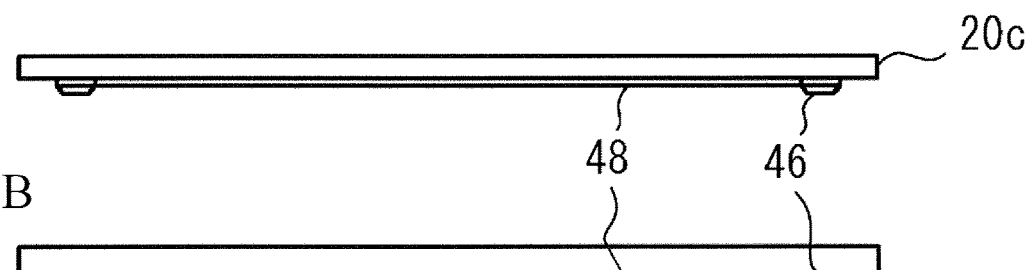
FIG. 4A illustrates a side view of a cap portion in accordance with a second embodiment.
Figure 4B:
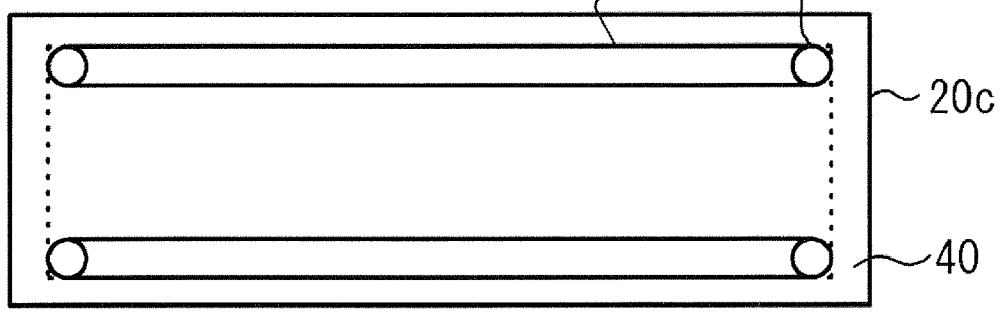
FIG. 4B illustrates a bottom view of the cap portion.
Figure 5:
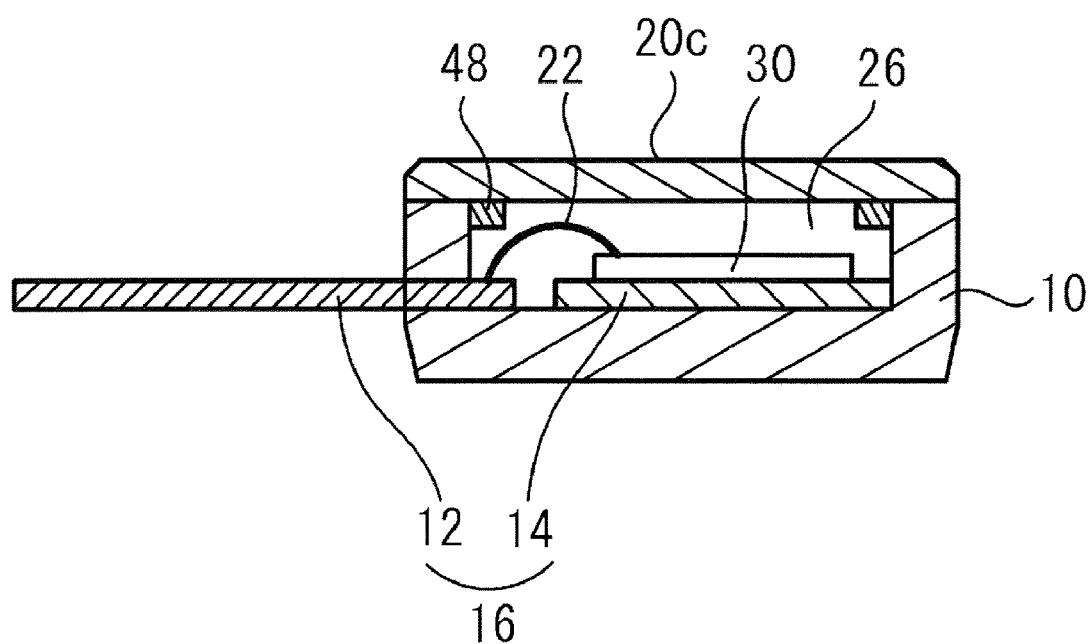
FIG. 5 illustrates a cross sectional view of a surface acoustic wave device in accordance with the second embodiment.

A description will be given of a cap portion having a linear-shaped convex portion in a second embodiment. As shown in FIG. 4A and FIG. 4B, a cap portion 20c has a linear-shaped convex portion 48 that is formed along the side face of the surrounding portion 10 on the side of the cavity 26. FIG. 4A illustrates a side view of a surface acoustic wave device in accordance with the second embodiment. A part of a side face of the linear-shaped convex portion 48 is adhered to the side face of the cap portion 20c on the side of the cavity 26. Adherence is more strengthened between the surrounding portion 10 and the cap portion 20c than that of the first embodiment, because the linear-shaped convex portion 48 is linearly adhered to the side face of the surrounding portion 10 on the side of the cavity 26. The linear-shaped convex portion 48 is provided on at least one of the sides surrounded by the adhering face.

If the linear-shaped convex portion 48 is provided on all of the sides, the cap portion 20 tends to be distorted because of heat. On the other hand, the adherence strength is not sufficient, in a case where the linear-shaped convex portion 48 is on one of the sides or two of the continuing sides in L shape. It is therefore preferable that the linear-shaped convex portion 48 is linearly formed along a pair of the facing side faces of the surrounding portion 10 on the side of the cavity 26 and is not formed along the other faces of the surrounding portion 10 on the side of the cavity 26. It is preferable that the linear-shaped convex portion 48 is formed along the side face according to a long side of the cavity 26, in order to strengthen the adherence.

It is preferable that the base portion 11 is adhered to the cap portion 20 with an adhesive agent made of an epoxy resin, in the first embodiment and in the second embodiment. And, it is preferable that the base portion 11 and the cap portion 20 are made of a thermosetting epoxy resin or a thermoplastic resin. In this case, adherence is strengthened between the surrounding portion 10 and the cap portion 20.

In the first embodiment and the second embodiment, the surrounding portion 10 of the base portion 11 forms the side face of the cavity 26. However, the base portion 11 may have a plane shape. And the cap portion 20 may form the side face of the cavity 26. In this case, it is preferable that the round-shaped convex portion 46 in accordance with the first embodiment and the linear-shaped convex portion 48 in accordance with the second embodiment are provided on the base portion 11. That is, it is preferable that one of the base portion 11 and the cap portion 20 has a convex portion on an inside of the adhering face thereof where the base portion 11 and the cap portion 20 are adhered.

While the above description constitutes the preferred embodiments of the present invention, it will be appreciated that the invention is susceptible of modification, variation and change without departing from the proper scope and fair meaning of the accompanying claims.

The present application is based on Japanese Patent Application No. 2006-311491 failed Nov. 17, 2006, the entire disclosure of which is hereby incorporated by reference.

What is claimed is:

1. A surface acoustic wave device comprising:
   a base portion that surrounds a surface acoustic wave element and is made of a resin; and
   a cap portion that is adhered onto the base portion so that a cavity sealing the surface acoustic wave element is formed, and is made of a resin,
   wherein:
   at least one of an adhering face of the base portion and an adhering face of the cap portion adhering the base portion and the cap portion is subjected to a grain finish or a dull finish,
   a convex portion is provided inside of the adhering face that is of one of the base portion and the cap portion adhered to the other,
   the convex portion is linearly formed along a pair of side faces of the base portion and the cap portion on a side of the cavity, and
   the convex portion is not formed along another face on the side of the cavity.

2. A surface acoustic wave device comprising:
   a base portion that surrounds a surface acoustic wave element and is made of a resin; and a cap portion that is adhered onto the base portion so that a cavity sealing the surface acoustic wave element is formed and is made of a resin, wherein:

at least one of an adhering face of the base portion and an adhering face of the cap portion adhering the base portion and the cap portion is subjected to a grain finish or a dull finish;

a convex portion is provided inside of the adhering face that is of one of the base portion and the cap portion adhered to the other; and the base portion has a lead frame that mounts the surface acoustic wave element thereon and a surrounding portion made of a resin that surrounds the surface acoustic wave element.

3. The surface acoustic wave device as claimed in claim 1, wherein a part of the side face of the convex portion is adhered to the side face of the other of the base portion and the cap portion on the side of the cavity.

4. The surface acoustic wave device as claimed in claim 3, wherein the convex portion is formed along the side face on the long side of the cavity.

5. The surface acoustic wave device as claimed in claim 1, wherein the base portion and the cap portion are adhered to each other with an adhesive agent made of an epoxy resin.

6. The surface acoustic wave device as claimed in claim 1, wherein the base portion and the cap portion are made of a thermosetting epoxy resin or a thermoplastic resin.

* * * * *